United States Patent
Booth, Jr. et al.

(10) Patent No.: US 7,095,164 B1
(45) Date of Patent: Aug. 22, 2006

(54) DISPLAY SCREEN

(75) Inventors: Lawrence A. Booth, Jr., Phoenix, AZ (US); Kannan Raj, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 766 days.

(21) Appl. No.: 09/662,660

(22) Filed: Sep. 15, 2000

Related U.S. Application Data

(63) Continuation-in-part of application No. 09/318,501, filed on May 25, 1999, now Pat. No. 6,326,723, and a continuation-in-part of application No. 09/318,683, filed on May 25, 1999, now Pat. No. 6,175,442.

(51) Int. Cl.
  G02C 26/00 (2006.01)
  H01J 29/10 (2006.01)
(52) U.S. Cl. ............ 313/461; 313/110; 313/112; 359/15; 359/885
(58) Field of Classification Search ........ 313/495–497, 313/461, 500, 505, 512, 110, 112; 359/15, 359/13; 349/201, 202; 345/7–9
See application file for complete search history.

(56) References Cited

U.S. PATENT DOCUMENTS

| | | | |
|---|---|---|---|
| 4,814,800 A * | 3/1989 | Lavinsky et al. | 353/50 |
| 5,142,385 A | 8/1992 | Anderson et al. | |
| 5,300,169 A * | 4/1994 | Tahara | 156/230 |
| 5,656,360 A * | 8/1997 | Faykish et al. | 428/195.1 |
| 5,668,662 A * | 9/1997 | Magocs et al. | 359/452 |
| 5,817,396 A * | 10/1998 | Perlo et al. | 428/141 |
| 5,875,122 A | 2/1999 | Acharya | |
| 5,877,893 A * | 3/1999 | Kim | 359/456 |
| 5,995,210 A | 11/1999 | Acharya | |
| 6,002,500 A * | 12/1999 | Kim | 359/15 |
| 6,009,201 A | 12/1999 | Acharya | |
| 6,009,206 A | 12/1999 | Acharya | |
| 6,047,303 A | 4/2000 | Acharya | |
| 6,091,851 A | 7/2000 | Acharya | |
| 6,094,508 A | 7/2000 | Acharya et al. | |
| 6,108,453 A | 8/2000 | Acharya | |
| 6,130,960 A | 8/2000 | Janusz et al. | |
| 6,124,811 A | 9/2000 | Acharya et al. | |
| 6,151,069 A | 11/2000 | Dunton et al. | |
| 6,151,163 A * | 11/2000 | Hall, Jr. et al. | 359/457 |
| 6,151,415 A | 11/2000 | Acharya et al. | |
| 6,154,493 A | 11/2000 | Acharya et al. | |
| 6,166,664 A | 12/2000 | Acharya | |
| 6,178,269 B1 | 1/2001 | Acharya | |
| 6,195,026 B1 | 2/2001 | Acharya | |
| 6,215,908 B1 | 4/2001 | Pazmino et al. | |
| 6,215,916 B1 | 4/2001 | Acharya | |
| 6,229,578 B1 | 5/2001 | Acharya et al. | |
| 6,233,358 B1 | 5/2001 | Acharya | |
| 6,236,433 B1 | 5/2001 | Acharya et al. | |
| 6,236,765 B1 | 5/2001 | Acharya | |
| 6,269,181 B1 | 7/2001 | Acharya | |
| 6,275,206 B1 | 8/2001 | Tsai et al. | |
| 6,285,796 B1 | 9/2001 | Acharya et al. | |
| 6,292,114 B1 | 9/2001 | Tsai et al. | |
| 6,301,392 B1 | 10/2001 | Acharya | |
| 6,594,073 B1 * | 7/2003 | Wang | 359/350 |

FOREIGN PATENT DOCUMENTS

GB  2311873 A  * 10/1997

OTHER PUBLICATIONS

U.S. Appl. No. 09/885,415, filed Jun. 1997, Acharya.
U.S. Appl. No. 09/008,131, filed Jan. 1998, Acharya et al.
U.S. Appl. No. 09/034,625, filed Mar. 1998, Acharya.
U.S. Appl. No. 09/040,806, filed Mar. 1998, Acharya.
U.S. Appl. No. 09/048,901, filed Mar. 1998, Acharya.
U.S. Appl. No. 09/050,743, filed Mar. 1998, Acharya.
U.S. Appl. No. 09/154,336, filed Sep. 1998, Acharya.
U.S. Appl. No. 09/165,511, filed Oct. 1998, Acharya et al.
U.S. Appl. No. 09/191,310, filed Nov. 1998, Acharya et al.
U.S. Appl. No. 09/199,836, filed Nov. 1998, Acharya et al.
U.S. Appl. No. 09/207,753, filed Dec. 1998, Acharya.
U.S. Appl. No. 09/258,636, filed Feb. 1998, Acharya et al.
U.S. Appl. No. 09/291,810, filed Apr. 1999, Acharya.
U.S. Appl. No. 09/202,763, filed Apr. 1999, Acharya et al.
U.S. Appl. No. 09/301,753, filed Apr. 1999, Acharya et al.
U.S. Appl. No. 09/320,192, filed May 1999, Acharya et al.
U.S. Appl. No. 09/328,935, filed Jun. 1999, Acharya et al.
U.S. Appl. No. 09/342,863, filed Jun. 1999, Acharya et al.
U.S. Appl. No. 09/359,831, filed Jul. 1999, Acharya et al.
U.S. Appl. No. 09/383,117, filed Aug. 1999, Acharya et al.
U.S. Appl. No. 09/390,255, filed Sep. 1999, Acharya et al.
U.S. Appl. No. 09/393,017, filed Sep. 1999, Acharya et al.
U.S. Appl. No. 09/393,136, filed Sep. 1999, Acharya et al.
U.S. Appl. No. 09/406,032, filed Sep. 1999, Acharya.
U.S. Appl. No. 09/410,800, filed Oct. 1999, Acharya et al.
U.S. Appl. No. 09/411,697, filed Oct. 1999, Acharya et al.
U.S. Appl. No. 09/429,058, filed Oct. 1999, Acharya et al.
U.S. Appl. No. 09/461,068, filed Dec. 1999, Acharya.
U.S. Appl. No. 09/461,080, filed Dec. 1999, Acharya.
U.S. Appl. No. 09/467,487, filed Dec. 1999, Acharya et al.
U.S. Appl. No. 09/478,643, filed Dec. 1999, Acharya et al.
U.S. Appl. No. 09/482,551, filed Jan. 2000, Acharya et al.
U.S. Appl. No. 09/494,087, filed Jan. 2000, Acharya.
U.S. Appl. No. 09/507,213, filed Feb. 2000, Acharya et al.
U.S. Appl. No. 09/507,399, filed Feb. 2000, Acharya et al.
U.S. Appl. No. 09/519,135, filed Mar. 2000, Acharya et al.
U.S. Appl. No. 09/519,874, filed Mar. 2000, Acharya et al.
U.S. Appl. No. 09/591,867, filed Jun. 2000, Acharya et al.

(Continued)

*Primary Examiner*—Ashok Patel
(74) *Attorney, Agent, or Firm*—Paul E. Steiner

(57) ABSTRACT

Several embodiments in accordance with the invention are disclosed. In one particular embodiment, a display screen for a display is discussed.

22 Claims, 4 Drawing Sheets

OTHER PUBLICATIONS

U.S. Appl. No. 09/595,055, filed Jun. 2000, Acharya et al.
U.S. Appl. No. 09/596,127, filed Jun. 2000, Acharya et al.
U.S. Appl. No. 09/597,354, filed Jun. 2000, Acharya et al.
U.S. Appl. No. 09/607,724, filed Jun. 2000, Acharya et al.
U.S. Appl. No. 09/608,989, filed Jun. 2000, Acharya et al.
U.S. Appl. No. 09/608,991, filed Jun. 2000, Acharya et al.

D.W. Vance, "A Novel High-Resolution Ambient-Light-Rejecting Rear-Projection Screen", Jenmar Visual Systems, Paso Robles, CA, SID Digest 1994, 34.2, p. 741-744.

J.M. Tedesco, L.A.K. Brady, W.S. Colburn, "Holographic Diffusers for LCD Backlights and Projection Screens", Kaiser Optical Systems Inc., SID Disgest 1993, 5.3, p. 29-32.

* cited by examiner

Detail - shows bidirectional holographic film used to manage internal reflection

DISPLAY SCREEN

RELATED APPLICATIONS

This patent application is a continuation-in-part of U.S. patent application Ser. No. 09/318,501, filed on May 25, 1999, titled, "Display Screen," Raj at el., now U.S. Pat. No. 6,326,723, and of U.S. patent application Ser. No. 09/318,683, filed on May 25, 1999, titled, "Anti-Reflection Layer in Spatial Light Modulators," by Booth et al., now U.S. Pat. No. 6,175,442, these applications being concurrently filed, and assigned to the assignee of the present invention.

This patent application is also related to concurrently filed U.S. patent application Ser. No. 09/662,656, titled, "Tiled Display Screen," by Booth et al., assigned to the assignee of the present invention, and herein incorporated by reference.

BACKGROUND

The present disclosure is related to displays, such as display screens.

Display contrast is a factor in the visual quality of a display system. Techniques for improving the contrast of such systems continue to be desirable.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 is a schematic diagram illustrating an embodiment of a display screen in accordance with the present invention;

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously discussed, display contrast is a factor in the visual quality of a display system. While some displays or display screens have good contrast in conditions of no or nearly no ambient illumination, such displays or display screens have reduced contrast where ambient illumination is present. This is sometimes due, at least in part, to reflectance of this ambient illumination. Likewise, even in conditions of no or nearly no ambient illumination, display contrast might be improved if light scattering internal to the screen is reduced and, perhaps, even eliminated. Some embodiments in accordance with the invention, such as those described hereinafter, may provide such improved contrast.

Figure 1:
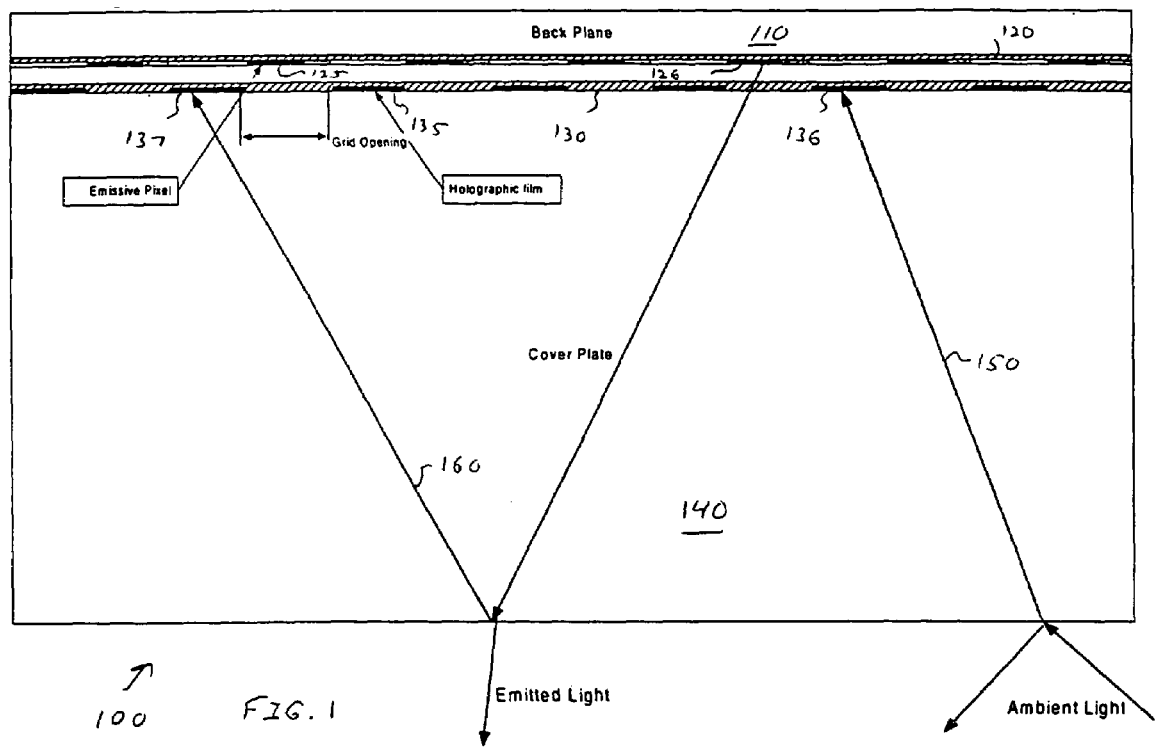
FIG. 1 is a schematic diagram illustrating an embodiment of a display screen.

FIG. 1 is a schematic diagram illustrating an embodiment 100 of a display screen. FIG. 1 illustrates a cross-sectional view from above. As illustrated in FIG. 1, this embodiment includes a back plane layer 110, a layer 120 that includes emissive pixels, such as 125, a layer 130 that includes holographic film patches, such as 135, and a substrate or cover plate 140. Typically, as will be appreciated by those of ordinary skill in the art, these layers may be comprised of the following materials. Emissive pixel materials, such as layer 120, may comprise inorganic or organic electro-luminescent materials, such as organic light emitting polymers. Holographic film patches may comprise photopolymer or dichroics; back plane layer 110 may comprise ceramic; and substrate of plate 140 may comprise any commonly used optical quality glass; however, other materials may also be employed.

As FIG. 1 illustrates, a holographic film, such as patches 135, 136, and 137, applied to the inside of cover plate 140 absorbs light from the ambient environment incident on the cover plate, such as light ray 150. In this context, the term holographic film, patch, layer or the like, refers to a film, patch, or layer, for example, made of or including material or materials having the capability to affect or control the transmission or reflection of incident light of specific wavelengths, at least in part, through principles of diffraction. In addition, this film or these patches may absorb light emitted from emissive pixels, such as from 125 or 126, as, for example, where emitted light is back scattered or reflected backwards from the cover plate material or from the interface between the cover plate and the ambient environment, in this example, air. Light ray 160 illustrates this in FIG. 1. In this context, the term holographic film, patch, layer or the like, refers to a film, patch, or layer, for example, made of or including material or materials having the capability to affect or control the transmission or reflection of incident light of specific wavelengths, at least in part, through principles of diffraction. Additional information about this technology may be obtained, for example, from "Holographic Diffusers for LCD Backlights and Projection Screens," by J. M. Tedesco et al., appearing in Society of Information Display (SID) 93 Digest, paper 5.3, pp. 29–32 (1993); "A Novel High-Resolution Ambient-Light-Rejection Rear Projection Screen," by D. W. Vance, appearing in SID 94 Digest, paper 34.2, pp. 741–744 (1994); and "Rear Projection Screen for Light Valve Projection Systems," by J. F. Goldenberg et al., appearing in Proc. of Society of Photo-Optical Engineers (SPIE), Vol. 3013, pp. 49–58 (1997).

However, as previously indicated, additional improvements in contrast remain desirable. For example, in FIG. 1, some ambient light and internal light that is scattered may not be absorbed. This light may reduce display contrast and, therefore, degrade visual quality.

Figure 2A:
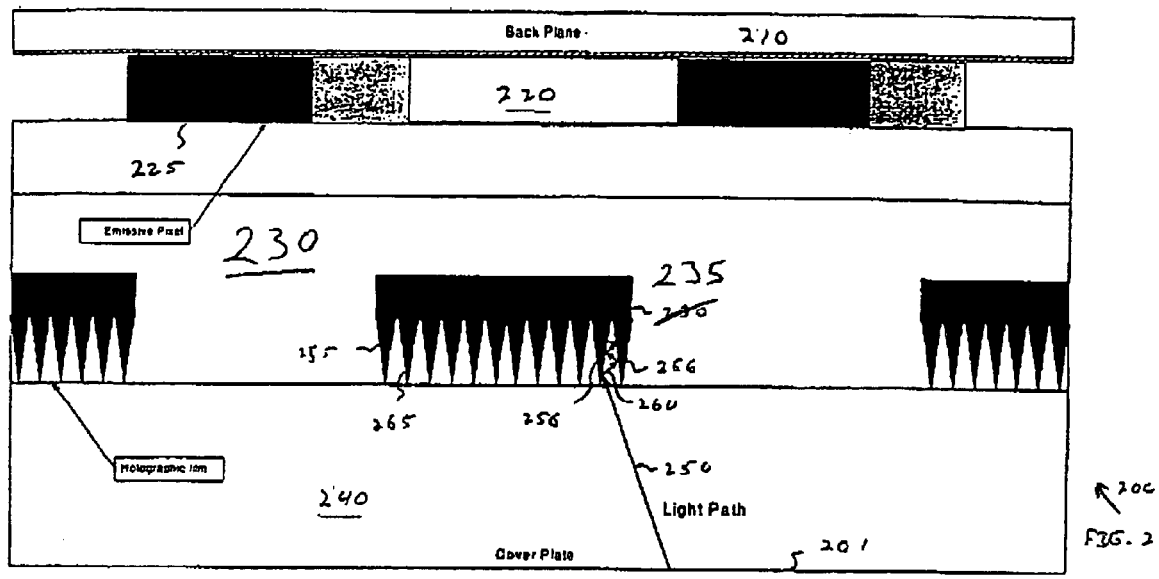
FIG. 2A is a schematic representation of a holographic film patch including structures having a pyramid-like shape.
Figure 2A:
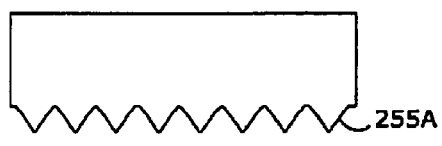

FIG. 2 is a schematic diagram of an embodiment 200 of a screen display in accordance with the invention. FIG. 2 is also a cross-sectional diagram shown from above. Of course, FIG. 2 illustrates only one of many possible embodiments within the scope of the present invention. Therefore, the invention is not restricted to this particular embodiment, and this particular embodiment, 200, is provided merely as an illustration.

Embodiment 200 in FIG. 2 illustrates a display screen, such as may be employed in a flat panel display for a display system. Although the invention is not limited in scope in this respect, such systems may employ liquid crystal technology. This particular embodiment includes a back plane layer 210, a layer 220 including emissive pixels, such as 225, a layer 230 that includes holographic film patches, such as 235, and a cover plate layer 240. Here, the layers combine to form a display screen having a structure so that at least some light is emitted from the emissive pixel layer into the ambient environment. This is desirable so that an image on the display screen may be viewed. In addition, the holographic film layer includes patches of holographic film having a front and back side, where the front side of the holographic film patches faces the cover plate layer and adjacent structures are formed therein, such as 255 and 265 or 256 and 266, to trap at least some incident light, as described in more detail below.

Figure 2B:
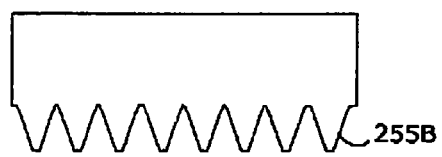
FIG. 2B is a schematic representation of a holographic film patch including structures having a pillar-like shape.

As illustrated in FIG. 2, the layer that includes the holographic film 230 is patterned as a grid in this embodiment. This provides openings for emitted light to be transmitted to a viewer capable of perceiving an image on the display screen, for example. However, the holographic patches or plates comprise a material capable of absorbing at least a portion of light incident upon the material. Furthermore, as illustrated in FIG. 2 by light rays 250 and 260, the adjacent structures, such as 256 and 266, are formed to trap light incident upon the material that is not initially absorbed by the material. In this particular embodiment, structures, such as 255 and 265, have a moth-eye-like shape, although the invention is not limited in scope in this respect. A variety of shapes may be employed that are capable of trapping light, as desired. For example, alternatively, a pyramid-like shape (e.g. see structure 255A in FIG. 2A) or a pillar-like shape (e.g. see structure 255B in FIG. 2B) may be employed. As illustrated, in this embodiment, the structures are shaped so that incident light not initially absorbed by the holographic film is reflected to again impinge upon the material. Furthermore, here the structures are shaped so that even if light is not absorbed after multiple reflections, it will continue to impinge upon the material. In this context, this is referred to as "trapping" the light, such as for light that is either not reflected out of the screen display or that is reflected within the screen display, but away from the holographic film or patch, in this particular embodiment.

The invention is not limited in scope to a particular holographic material, however, examples of such material include: Photopolymers, such as available from E.I. du Pont de Nemours and Company, Wilmington, Del. (hereinafter, "DuPont"); and/or High Energy Beam Sensitive (HEBS) glass, such as available from Canyon Materials, Inc. The amount of absorption and reflection that occurs for incident light depends at least in part upon the particular material employed; however, material, such as photopolymers, for example, may be employed in some embodiments, for example, where approximately in the range of from 2 to 10 percent of the incident light is reflected. Therefore, due at least in part to the shape of the adjacent structures, unabsorbed light is reflected so that the next time it impinges upon the material it may be approximately 90 to 98 percent absorbed and approximately 2 to 10 percent reflected, for this embodiment, although, the invention is not limited in scope to these percentages and they may vary depending upon a variety of factors. However, again, this may be repeated multiple times so that a relatively small amount of bulk reflectance takes place.

Holographic films having the desired structure may be fabricated on planarized surfaces using a technique called interference lithography, although the invention is not limited in scope to employing only this technique. For example, Holographic Lithography Systems, based in Bedford, Mass., employs such fabrication techniques. In this context, the term interference lithography refers to a holographic technique, typically maskless, in which patterning of material occurs via electromagnetic interference. Using such an approach, feature sizes as small as 90 nanometers, for example, may be patterned over a relatively wide area. Likewise, this technique may be employed to fabricate structures such as 255 and 265 or 256 and 266, shown in FIG. 2 and as previously described. In addition to producing structures having relatively low reflectance over relatively large wavelength bands and relatively large angular acceptance ranges, this approach allows for fabricating the structures for wavelength selectivity or "tuning." For example, this may be employed in some embodiments to provide color balancing, if desired. Again, although the invention is not limited in scope in this respect, one example of a commercially available holographic film suitable for such fabrication is available from DuPont.

In an alternative approach, HEBS gray level masks may enable mass production of three-dimensional (3D) microstructures that may also be employed. For example, it may be possible to fabricate a gray-level or gray-scale mask using a standard e-beam tool. HEBS-glass turns dark upon exposure to an electron beam. Furthermore, controlling the electron dosage may control the level of darkness. Therefore, HEBS-glass may be capable of resolution to molecular dimensions. There are a number of potential advantages, such as reduction in alignment errors, reduction in the use of chemicals, and an economical mask fabrication technique. Canyon Materials, Inc., San Diego, Calif., for example, makes custom HEBS-glass gray level masks. These gray-level masks enable mass fabrication of 3-D microstructures and may employed in several fields of micro technology, including fabrication of embodiments of holographic films and/or patches in accordance with the present invention. Again, the forgoing are just two examples of techniques that may be employed to fabricate the desired structures and the invention is not in scope to a particular technique.

Figure 3:
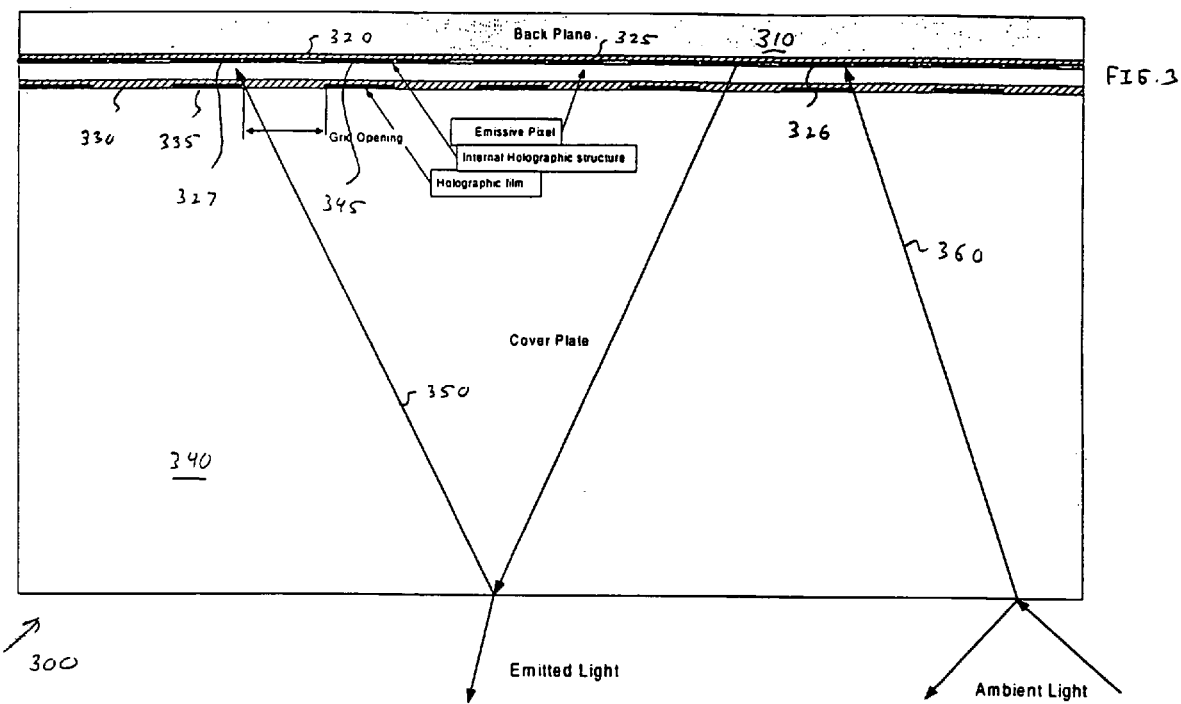
FIG. 3 is a schematic diagram illustrating another embodiment of a display screen in accordance with the present invention.

FIG. 3 is a schematic diagram illustrating another embodiment in accordance with the invention, again, illustrated in cross-section from above. Here, embodiment 300 comprises a screen display that includes a back plane 310, emissive pixels, such as 325, holographic film patches, such as 335 and 345, and a cover plate, 340, combined in layers to form a display screen having a structure so that at least some emitted light is transmitted into the ambient environment and so that at least some light propagating within a layer that includes emissive pixels is absorbed, although, again, the invention is not limited to this particular embodiment.

This embodiment is similar to the previous embodiment in that both light reflected within the display screen and ambient light transmitted into the display screen is absorbed by a holographic film. This is illustrated, for example, by light rays 350 and 360. Whereas in the previous embodiment light is absorbed by adjacent structures, here, the holographic patches are positioned in different layers so that light that is scattered or reflected to within the layer that includes the emissive pixels may be absorbed. This is illustrated in FIG. 3 by light ray 360 and patch 326 and by light ray 350 and patch 327.

Figure 4:
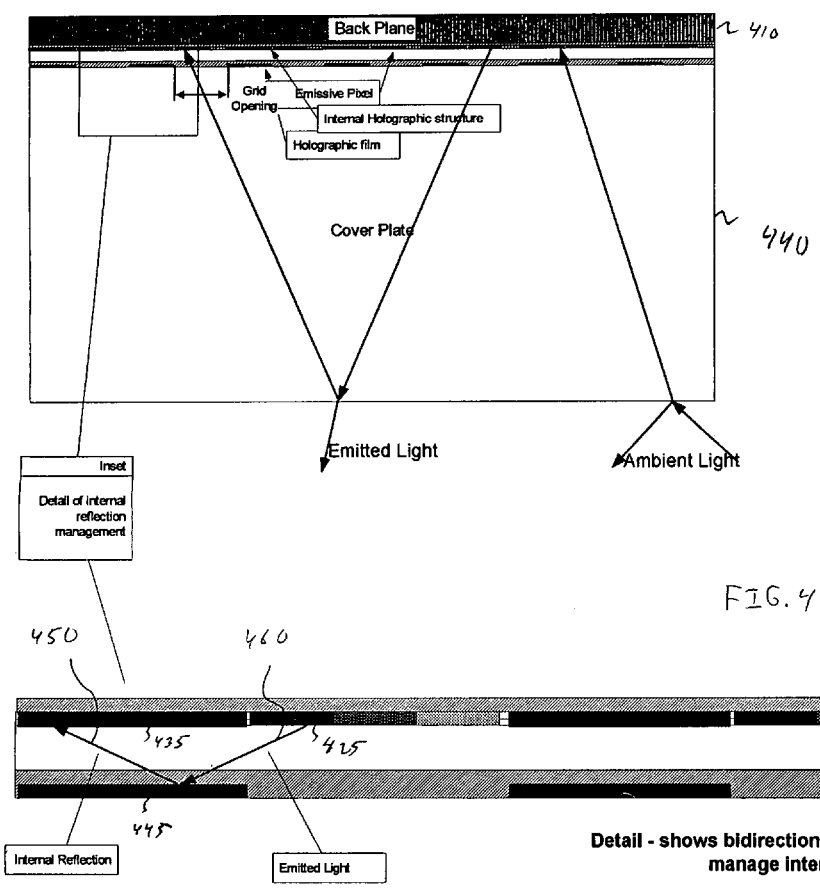
FIG. 4 is a schematic diagram illustrating yet another embodiment of a display screen in accordance with the present invention.

FIG. 4 is a schematic diagram illustrating yet another embodiment in accordance with the invention, again, illustrated in cross-section from above. Here, embodiment 400 comprises a screen display that includes a back plane 410, emissive pixels, such as 425, holographic film patches, such as 435 and 445, and a cover plate, 440, combined in layers to form a display screen having a structure so that at least some emitted light is transmitted into the ambient environment and so that at least some light propagating within a layer that includes emissive pixels is absorbed, although, again, the invention is not limited to this particular embodiment.

This embodiment is similar to the previous embodiment; however, whereas in the previous embodiment light is absorbed by holographic patches positioned in different layers so that light that is scattered or reflected to within the layer that includes the emissive pixels may be absorbed by a holographic film, in FIG. 4, some holographic film or films are being employed to reflect a major portion of the incident light. This is illustrated in FIG. 4 by light rays 450 and 460 and patch 445, for example. Therefore, the invention is not limited in scope to employing holographic materials primarily to absorb incident light. In some embodiments, depending on the circumstances, holographic materials may also be employed in some instances, at least, primarily to reflect incident light.

An embodiment of a method of trapping at least a portion of light incident upon the front side of a holographic film, such as may be performed by embodiment 200 illustrated in FIG. 2, for example, includes the following. At least a portion of the light, in some embodiments, as previously described, a major portion of the light incident on the front side of holographic film, such as 230, illustrated in FIG. 2, for example, may be absorbed. Likewise, the remaining incident light that is not absorbed, at least initially, may be reflected in a manner so as to be incident upon the front side of the holographic film again. For the light that is again incident upon the front side of the holographic film, at least a portion, in some embodiments, as previously described, a major portion, of this again incident light may be absorbed into the front side of the holographic film, whereas the remaining, not absorbed, again incident light may be reflected in a manner so as to be incident upon the front side of the holographic film yet again. This may be repeated multiple times. At least some of the light initially incident upon the front side of the holographic film may comprise light reflected backwards, such as reflected or scattered from inside face 201 of cover plate 240 in FIG. 2, for example.

In another embodiment, a method of trapping at least a portion of light scattered by an inside face, such as 201, of a cover plate, such as 240, of a display, such as 200, may include the following. At least some of the scattered light incident on the front side of a holographic film, such as patch 235, may be absorbed, in some embodiments, a major portion. The remaining scattered light incident on the front side of the holographic film may be reflected in a manner so as to be again incident upon the front side of the holographic film after reflection. Furthermore, again, as described for the previous embodiment, this may be repeated multiple times. For example, in one embodiment, as illustrated in FIG. 2, light may be reflected between two adjacent structures, such as 255 and 265 or 256 and 266, in the front side of the holographic film or patch It will, of course, be understood that, although particular embodiments have just been described, the invention is not limited in scope to a particular embodiment or implementation. Likewise, although the invention is not limited in scope in this respect, one embodiment may comprise an article, such as a display screen. Such a display screen may be employed, for example, as part of a system, such as a host computer, a computing system, a platform, or an imaging system.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

The invention claimed is:

1. A display comprising:
    a back plane layer; an emissive pixel layer; a holographic film layer; and a cover plate layer;
    said layers being combined to form a display screen having a structure so that at least some light is emitted from the emissive pixel layer into the ambient environment;
    said holographic film layer including patches of holographic film having a front and back side, the front side of the holographic film patches facing the cover plate layer and adjacent structures formed thereon to trap at least some incident light therebetween.

2. The display of claim 1, wherein the adjacent structures comprise moth-eye-like shaped adjacent structures.

3. The display of claim 1, wherein the adjacent structures comprise pyramid-like shaped adjacent structures.

4. The display of claim 1, wherein the adjacent structures comprise pillar-like shaped adjacent structures.

5. The display of claim 1, wherein the display comprises a flat panel display.

6. The display of claim 1, wherein said layers are combined to form a display screen having a structure so that at least some light is emitted from the emissive pixel layer into the ambient environment via openings in the holographic layer and through the cover plate layer.

7. A method of trapping at least a portion of light scattered by an inside face of a cover plate of a display comprising:
    absorbing at least some of the scattered light incident on the front side of a holographic film; and
    reflecting the remaining scattered light incident on the front side of the holographic film in a manner so as to be again incident upon the front side of the holographic film after reflection.

8. The method of claim 7, and further comprising:
    for the light again incident upon the front side of the holographic film after reflection,
        absorbing at least a portion of the light again incident upon the front side of the holographic film; and
        reflecting the remaining light again incident in a manner so as to be yet again incident upon the front side of the holographic film after reflection.

9. The method of claim 7, wherein absorbing at least some of the incident scattered light comprises absorbing a major portion of the incident scattered light.

10. The method of claim 9, wherein a major portion comprises a percentage of the incident light approximately in the range of 90 to 98 percent.

11. A film layer for a display, comprising:
    a holographic film;
    said holographic film having a front and back side;
    the front side of the holographic film having adjacent structures formed therein to trap at least some incident light therebetween,
    wherein the adjacent structures comprise at least one of the following: moth-eye-like shaped structures, pyramid-like shaped structures, and pillar-like shaped structures.

12. A method of trapping at least a portion of light incident upon the front side of a holographic film comprising:
- absorbing at least a portion of the incident light on the front side of the holographic film; and
- reflecting the remaining incident light in a manner so as to be again incident upon the front side of the holographic film after reflection.

13. The method of claim 12, and further comprising:
for the light again incident upon the front side of the holographic film after reflection,
- absorbing at least some portion of the light again incident upon the front side of the holographic film; and
- reflecting the remaining light again incident upon the front side of the holographic film in a manner so as to be yet again incident upon the front side of the holographic film.

14. The method of claim 12, wherein at least some of the light incident upon the front side of the holographic film comprises light reflected backwards.

15. The method of claim 12, wherein absorbing at least some of the incident light comprises absorbing a major portion of the incident light.

16. The method of claim 15, wherein a major portion comprises a percentage of the incident light approximately in the range of 90 to 98 percent.

17. An article comprising:
a back plane, emissive pixels, holographic film patches, and a cover plate combined in layers to form a display screen having a structure so that at least some emitted light is transmitted into the ambient environment and so that at least some light propagating within a layer that includes emissive pixels is absorbed by one or more of said holographic film patches.

18. The article of claim 17, wherein absorbed light comprises at least one of emitted light reflected within the display screen and ambient light transmitted into the display screen.

19. The article of claim 18, wherein the absorbed light at least comprises emitted light reflected backwards within the display screen prior to absorption.

20. The article of claim 18, wherein said holographic film patches include adjacent structures formed therein to trap at least some incident light.

21. The article of claim 18, wherein absorbed light at least comprises both emitted light reflected within the display screen and ambient light transmitted into the display screen.

22. The article of claim 17, wherein display screen further having a structure so that at least some light propagating within said layer is reflected by one or more of said holographic film patches.

* * * * *